US 8,471,623 B2

(12) United States Patent
Xiong et al.

(10) Patent No.: US 8,471,623 B2
(45) Date of Patent: Jun. 25, 2013

(54) INTEGRATED CIRCUIT (75) Inventors: Jiang Xiong, Zhuhai (CN); Hongwei Huang, Zhuhai (CN)

(73) Assignee: Actions Semiconductor Co., Ltd., Zhuhai, Guangdong (CN)

(*) Notice: Subject to any disclaimer, the term of this patent is extended or adjusted under 35 U.S.C. 154(b) by 73 days.

(21) Appl. No.: 13/255,727

(22) PCT Filed: May 6, 2010

(86) PCT No.: PCT/CN2010/072489
§ 371 (c)(1),
(2), (4) Date: Sep. 9, 2011

(87) PCT Pub. No.: WO2010/133136
PCT Pub. Date: Nov. 25, 2010

(65) Prior Publication Data
US 2011/0316615 A1 Dec. 29, 2011

(30) Foreign Application Priority Data
May 20, 2009 (CN) .......................... 2009 1 0138491

(51) Int. Cl.
*H01H 85/00* (2006.01)
(52) U.S. Cl.
USPC ........................................................ 327/525
(58) Field of Classification Search
USPC ................. 327/524, 525, 534, 535, 537, 540, 327/541
See application file for complete search history.

(56) References Cited

U.S. PATENT DOCUMENTS

| 5,909,142 | A | * | 6/1999 | Kawasaki et al. | 327/543 |
|---|---|---|---|---|---|
| 7,129,769 | B2 | * | 10/2006 | Dixon et al. | 327/525 |
| 7,532,058 | B2 | * | 5/2009 | Chen et al. | 327/525 |
| 2007/0077082 | A1 | | 4/2007 | Bartley et al. | |
| 2008/0263392 | A1 | | 10/2008 | Fujiwara et al. | |

FOREIGN PATENT DOCUMENTS

| CN | 1110441 | 10/1995 |
|---|---|---|
| CN | 1992297 | 7/2007 |
| CN | 101556825 | 10/2009 |

OTHER PUBLICATIONS

International Search Report for PCT/CN2010/072489 dated Jul. 8, 2010.

* cited by examiner

*Primary Examiner* — Jeffrey Zweizig
(74) *Attorney, Agent, or Firm* — Foley & Lardner LLP; James F. Ewing

(57) ABSTRACT

An integrated circuit, wherein a voltage-adjustable power supply circuit (42) receives a first power supply control signal (6) output by a programming power supply control circuit (41), outputs a first voltage signal to a efuse circuit (44) by a power source switching circuit (43) and outputs the first voltage signal to other functional circuits (45) of the integrated circuit, and the efuse circuit (44) receives the first voltage signal and a first programming control signal (5) output by the programming power supply control circuit (41) and burns out a corresponding efuse therein; or the voltage adjustable power supply circuit (42) receives a second power supply control signal (6) output by the programming power supply control circuit (41) and outputs a second voltage signal to other functional circuits (45) of the integrated circuit, and the efuse circuit (44) receives a second programming control signal (5) output by the programming power supply control circuit (41) and ensures a corresponding efuse therein not to be burnt out. Compared with the integrated circuit in the prior art, which integrates the effuse circuit (44), the integrated circuit of the invention saves production cost and use cost and also saves the lead pin resources of the integrated circuit.

10 Claims, 4 Drawing Sheets

INTEGRATED CIRCUIT

CROSS-REFERENCE TO RELATED APPLICATIONS

The present application is a US National Stage of International Application No. PCT/CN2010/072489, filed 6 May 2010, designating the United States, and claiming priority to Chinese Patent Application No. 200910138491.5, filed 20 May 2009. The foregoing applications are hereby incorporated herein by reference in their entireties.

FIELD OF THE INVENTION

The present invention relates to the field of integrated circuits and particularly to an integrated circuit integrated with an electronic fuse circuit.

BACKGROUND OF THE INVENTION

In recent years, an Integrated Circuit (IC) is increasingly subject to the precision and purity of a semiconductor process as the dimension of the process shrinks and the complexity of the integrated circuit increases. The entire integrated circuit may not normally operate due to the deviation or defect of the process. In order to address this problem, more and more design companies of integrated circuits integrate electronic fuse (EFUSE) circuits available from a process factory (e.g., Taiwan Semiconductor Manufacturing Company (TSMC), and United Manufacturing Company (UMC)) into the integrated circuits to repair the deviation of the process or replace a defective circuit, thereby improving the yield of the integrated circuits.

An EFUSE circuit is composed of numerous electronic fuse units, each of which may be selectively blown by current. EFUSE circuits are widely applied in memory circuits, and when it is found that a defective cell exists in a memory circuit, a corresponding electronic fuse unit is blown by current, and the blown electronic fuse unit transmits such a signal that the deflective memory cell is replaced with a reserved normal memory cell to ensure normal operation of the entire memory circuit.

Figure 1:
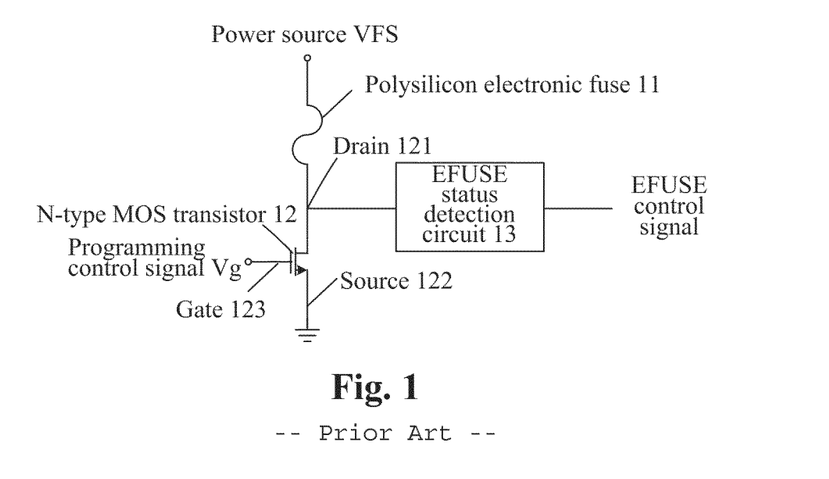
FIG. 1 illustrates a schematic diagram of a structure of a circuit of an electronic fuse unit in the prior art.

FIG. 1 illustrates a circuit of an electronic fuse unit including a conductive polysilicon electronic fuse 11, an N-type Metal Oxide Semiconductor (MOS) transistor 12 and an EFUSE status detection circuit 13. The polysilicon electronic fuse 11 has one terminal connected with a power source VFS and the other terminal connected with the drain 121 of the N-type metal oxide semiconductor transistor 12. The N-type metal oxide semiconductor transistor 12 has the source 122 grounded and the gate 123 connected with a programming control signal Vg. The EFUSE status detection circuit 13 has one terminal connected with the drain 121 of the N-type metal oxide semiconductor transistor 12 and the other terminal from which an EFUSE control signal is output. An IC controls a blown status of the polysilicon electronic fuse 11 by programming the voltage waveform of the programming control signal Vg. Without blowing the polysilicon electronic fuse 11, the programming control signal of Vg=0 is output, thus the N-type metal oxide semiconductor transistor 12 is turned off, and no current flows through the polysilicon electronic fuse 11 and the N-type metal oxide semiconductor transistor 12, so the polysilicon electronic fuse 11 will not be blown. Since the conductive polysilicon electronic fuse 11 is connected with the power source VFS, the drain 121 of the N-type metal oxide semiconductor transistor is in a low resistance status, the EFUSE status detection circuit 13 detects the low resistance status and outputs an EFUSE control signal of "1". To make the EFUSE status detection circuit output an EFUSE control signal of "0", the polysilicon electronic fuse 11 has to be blown. An operation principle thereof is as follows: the power source VFS is powered on so that the voltage of the power source VFS rises to a specific value, as illustrated in the voltage waveform of the power source VFS in FIG. 2; and after the power source VFS is powered on, the programming control signal Vg at a high level is output, as illustrated in the voltage waveform of the programming control signal Vg in FIG. 2. Since the programming control signal Vg is at a high level, the N-type metal oxide semiconductor transistor 12 is turned on and the polysilicon electronic fuse 11 is blown rapidly due to significant current flowing therethrough, and thereafter the programming control signal Vg at a low level is output and it is not necessary for the power source VFS to be at a high voltage. At this time the drain 121 of the N-type metal oxide semiconductor transistor is in a high resistance status and the EFUSE status detection circuit 13 detects the high resistance status and outputs the EFUSE control signal of "0".

Figure 2:
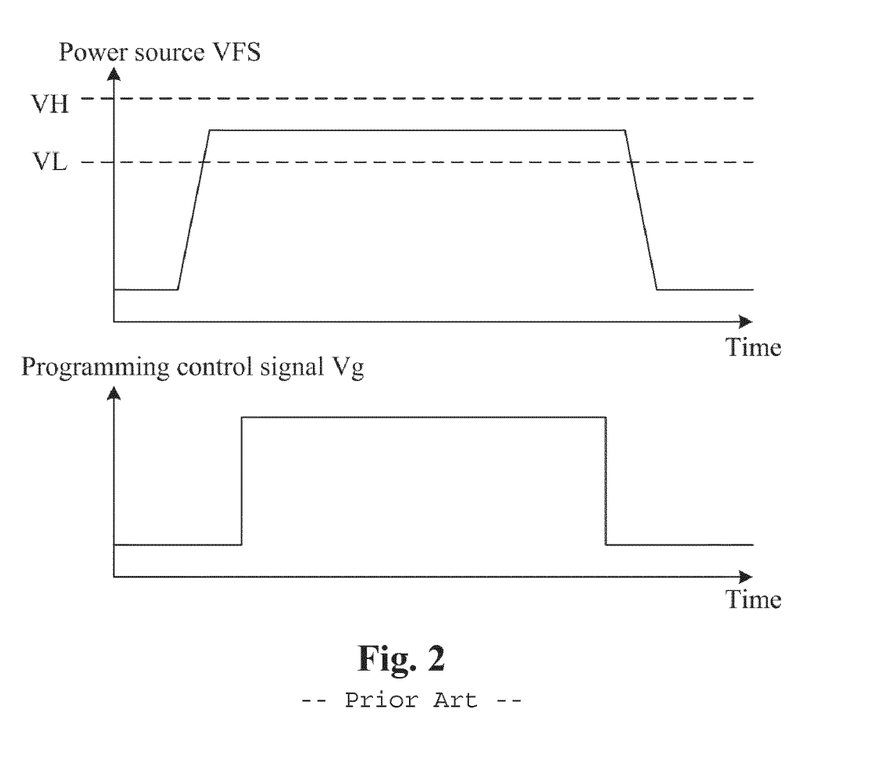
FIG. 2 illustrates a schematic diagram of a voltage during programming of the circuit of the electronic fuse unit in the prior art.

During programming, the voltage of the power source VFS has to be both above the lowest voltage VL in order to ensure sufficient power to blow the polysilicon electronic fuse 11 and below the highest voltage VH in order to prevent an excessive voltage thereof from blowing the N-type metal oxide semiconductor transistor 12, as illustrated in the dotted lines in FIG. 2. Typically, VL is at 3.8V and VH is at 4.2V. Furthermore, the voltage of the power source VFS is at zero or floats without programming, that is, the power source VFS satisfies the following conditions:

with programming: 3.8V<VFS<4.2V; and
without programming: at zero or floating.

However, there are conventional power sources of integrated circuits at 5V, 3.3V, 2.5V, 1.8V and 1.2V, thus an additional power supply circuit is required for an integrated circuit integrated with an EFUSE circuit to power the EFUSE circuit.

Figure 3:
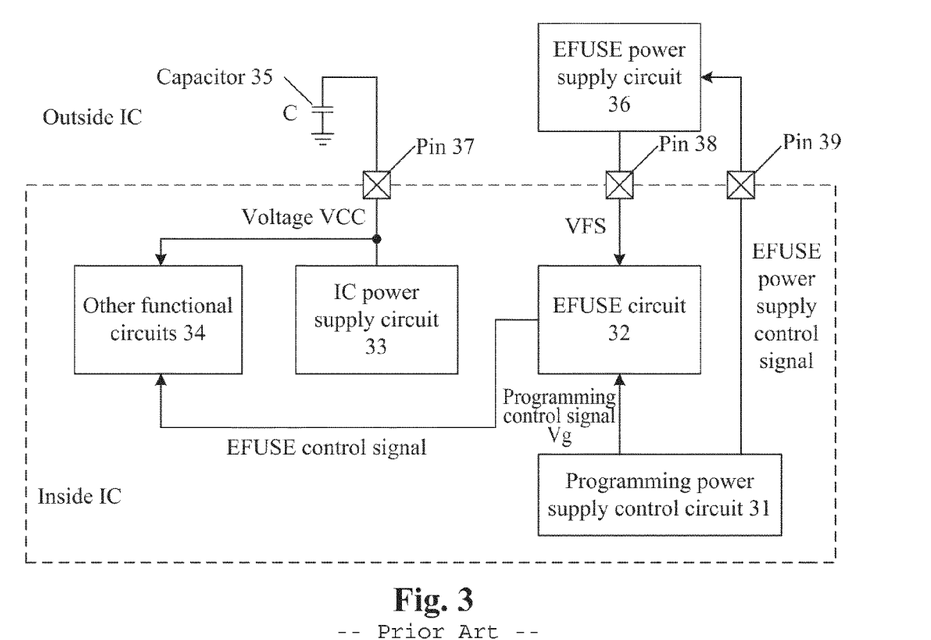
FIG. 3 illustrates a schematic diagram of a circuit for powering an integrated circuit integrated with an EFUSE circuit in the prior art.

FIG. 3 illustrates a schematic diagram of a circuit for powering an integrated circuit integrated with an EFUSE circuit in the prior art, which includes an IC internal circuit and an IC external circuit. The IC internal circuit includes a programming power supply control circuit 31, an EFUSE circuit 32, an IC power supply circuit 33 and other functional circuits 34 of the IC. The IC external circuit includes a capacitor 35 and an EFUSE power supply circuit 36. Signals between the IC internal circuit and the IC external circuit are transferred through three pins 37, 38 and 39.

An operation principle of the circuit illustrated in FIG. 3 is as follows: the IC power supply circuit 33 generates a voltage VCC connected with the capacitor 35 through the pin 37 of the integrated circuit, and the capacitor 35 functions to regulate the voltage VCC (the capacitor 35 and the pin 37 may be dispensed if the voltage VCC is not required with high stability), and also the voltage VCC powers the other functional circuits 34 of the IC; and the programming power supply control circuit 31 generates a programming control signal and an EFUSE power supply control signal to control the EFUSE circuit 32 and the EFUSE power supply circuit 36 respectively, and the EFUSE power supply circuit 36 generates a voltage VFS to power the EFUSE circuit 32 through the pin 38 of the IC. To program the EFUSE circuit 32, the programming power supply control circuit 31 outputs a first EFUSE power supply control signal to the EFUSE power supply circuit 36 through the pin 39 to control the EFUSE power supply circuit 36 to generate and output the voltage VFS between 3.8V and 4.2V to the EFUSE circuit 32 so that an electronic fuse in the EFUSE circuit 32 may be normally programmed. After programming of the electronic fuse in the EFUSE circuit 32, the programming power supply control circuit 31 outputs a second EFUSE power supply control signal to the EFUSE power supply circuit 36 through the pin 39 to control the EFUSE power supply circuit 36 to output the voltage VFS at a low level or no voltage VFS where the voltage VFS is at zero or floats. After programming of the electronic fuse in the EFUSE circuit 32, the EFUSE circuit 32 outputs an EFUSE control signal to control the other function circuits 34 of the IC to perform desired functions.

As can be apparent from the foregoing description, the EFUSE power supply circuit 36, the pins 38 and 39 have to be added correspondingly for integrating the EFUSE circuit 32 in the integrated circuit, thus increasing the production and usage costs of the integrated circuit.

SUMMARY OF THE INVENTION

Embodiments of the invention provides an integrated circuit which lowers the production and usage costs and saves the resources of pins of the integrated circuit as compared with the prior art.

An embodiment of the invention provides an integrated circuit including a programming power supply control circuit, a voltage adjustable power supply circuit, an electronic fuse circuit and a power source switch circuit, wherein:

the programming power supply control circuit outputs a first power supply control signal to the voltage adjustable power supply circuit and the power source switch circuit and outputs a first programming control signal to the electronic fuse circuit; or outputs a second power supply control signal to the voltage adjustable power supply circuit and the power source switch circuit and outputs a second programming control signal to the electronic fuse circuit;

the power source switch circuit receives the first power supply control signal and switches on a connection of the voltage adjustable power supply circuit with the electronic fuse circuit; or receives the second power supply control signal and switches off the connection of the voltage adjustable power supply circuit with the electronic fuse circuit;

the voltage adjustable power supply circuit receives the first power supply control signal and outputs a first voltage signal to the electronic fuse circuit through the power source switch circuit and to other functional circuits of the integrated circuit; or receives the second power supply control signal and outputs a second voltage signal to the other functional circuits of the integrated circuit; and the electronic fuse circuit receives the first programming control signal and the first voltage signal and blows corresponding one of electronic fuses in the electronic fuse circuit; or receives the second programming control signal and ensures the corresponding one of the electronic fuses in the electronic fuse circuit not to be blown.

The integrated circuit according to an embodiment of the invention further includes a voltage regulator capacitor having one terminal grounded and the other terminal connected with the voltage adjustable power supply circuit and receiving the first voltage signal or the second voltage signal.

The voltage adjustable power supply circuit is connected with one terminal of a voltage regulator capacitor arranged external to the integrated circuit through a pin of the integrated circuit and outputs the first voltage signal or the second voltage signal to the voltage regulator capacitor, and the voltage regulator capacitor has the other terminal grounded.

The voltage adjustable power supply circuit includes a first N-type metal oxide semiconductor transistor, a first P-type metal oxide semiconductor transistor, an operational amplifier, a first resistor, a second resistor and a second P-type metal oxide semiconductor transistor, wherein:

a gate of the first N-type metal oxide semiconductor transistor connects with a gate of the first P-type metal oxide semiconductor transistor; both a source of the first N-type metal oxide semiconductor transistor and a drain of the first P-type metal oxide semiconductor transistor connect with an inverting input of the operational amplifier; one terminal of the first resistor and one terminal of the second resistor connect with an in-phase input of the operational amplifier; the second resistor has the other terminal grounded; the first resistor has the other terminal connected with a drain of the second P-type metal oxide semiconductor transistor; and the second P-type metal oxide semiconductor transistor has a gate connected with an output of the operational amplifier; and the first N-type metal oxide semiconductor transistor has a drain to which a third voltage signal is input; the first P-type metal oxide semiconductor transistor has a source to which a fourth voltage signal is input; the first N-type metal oxide semiconductor transistor and the first P-type metal oxide semiconductor transistor have their gates to which the first power supply control signal or the second power supply control signal is input; the second P-type metal oxide semiconductor transistor has a source to which a voltage signal at 5V is input; and the other terminal of the first resistor and the drain of the second P-type metal oxide semiconductor output the first voltage signal or the second voltage signal.

The voltage adjustable power supply circuit includes a second N-type metal oxide semiconductor transistor, a third P-type metal oxide semiconductor transistor, an inductor, a comparator, an error amplifier, a first rheostat and a second rheostat, wherein:

a drain of the third P-type metal oxide semiconductor transistor and a drain of the second N-type metal oxide semiconductor transistor connect with one terminal of the inductor; a gate of the third P-type metal oxide semiconductor transistor and a gate of the second N-type metal oxide semiconductor transistor connect with an output of the comparator; the second N-type metal oxide semiconductor transistor has a source grounded; the comparator has an in-phase input connected with an output of the error amplifier; one terminal of the first rheostat and one terminal of the second rheostat connect with an in-phase input of the error amplifier; the second rheostat has the other terminal grounded; and the other terminal of the inductor connects with the other terminal of the first rheostat; and the third P-type metal oxide semiconductor transistor has a source to which a voltage signal at 5V is input; the comparator has an inverting input to which a triangle wave signal is input; the error amplifier has an inverting input to which a fifth voltage signal is input; the first rheostat and the second rheostat have their selection terminals to which the first power supply control signal or the second power supply control signal is input; and the other terminal of the inductor and the other terminal of the first rheostat output the first voltage signal or the second voltage signal.

The first rheostat includes a third N-type metal oxide semiconductor transistor, a fourth P-type metal oxide semiconductor transistor, a third resistor and a fourth resistor, wherein:

the third N-type metal oxide semiconductor transistor and the fourth P-type metal oxide semiconductor transistor have their gates connected; the third N-type metal oxide semiconductor transistor has a drain connected with a source of the fourth P-type metal oxide semiconductor transistor; the third N-type metal oxide semiconductor transistor has a source connected with one terminal of the third resistor; the fourth P-type metal oxide semiconductor transistor has a drain connected with one terminal of the fourth resistor; and the other terminal of the third resistor connects with the other terminal of the fourth resistor; and the third N-type metal oxide semiconductor transistor and the fourth P-type metal oxide semiconductor transistor have their gates to which the first power supply control signal or the second power supply control signal is input.

The second rheostat includes a fourth N-type metal oxide semiconductor transistor, a fifth P-type metal oxide semiconductor transistor, a fifth resistor and a sixth resistor, wherein:

the fourth N-type metal oxide semiconductor transistor and the fifth P-type metal oxide semiconductor transistor have their gates connected; the fourth N-type metal oxide semiconductor transistor has a drain connected with a source of the fifth P-type metal oxide semiconductor transistor; the fourth N-type metal oxide semiconductor transistor has a source connected with one terminal of the fifth resistor; the fifth P-type metal oxide semiconductor transistor has a drain connected with one terminal of the sixth resistor; and the other terminal of the fifth resistor connects with the other terminal of the sixth resistor; and the fourth N-type metal oxide semiconductor transistor and the fifth P-type metal oxide semiconductor transistor have their gates to which the first power supply control signal or the second power supply control signal is input.

The power source switch circuit is a P-type metal oxide semiconductor transistor, an N-type metal oxide semiconductor transistor or a triode.

In the integrated circuit according to the embodiments of the invention, the voltage adjustable power supply circuit receives the first power supply control signal output from the programming power supply control circuit and outputs the first voltage signal to the EFUSE circuit through the power source switch circuit and to the other functional circuits of the integrated circuit, and the EFUSE circuit receives the first voltage signal and the first programming control signal output from the programming power supply control circuit to blow the corresponding one of electronic fuses in the EFUSE circuit; or the voltage adjustable power supply circuit receives the second power supply control signal output from the programming power supply control circuit and outputs the second voltage signal to the other functional circuits of the integrated circuit, and the EFUSE circuit receives the second programming control signal output from the programming power supply control circuit to ensure the corresponding one of the electronic fuses in the EFUSE circuit not to be blown. As may be apparent, the voltage adjustable power supply circuit is both configured to power the other functional circuits of the integrated circuit and configured to power the EFUSE circuit to program the EFUSE circuit. That is, in the integrated circuit according to the embodiments of the invention, one power supply circuit is used to power the functional circuits in the integrated circuit, and as compared with the integrated circuit integrated with the EFUSE circuit in the prior art, no separate power supply circuit is required to power the EFUSE circuit, and the power supply circuit is integrated in the integrated circuit, thereby lowering the production and usage costs and saving the resources of pins of the integrated circuit.

DETAILED DESCRIPTION OF THE EMBODIMENTS

Figure 4:
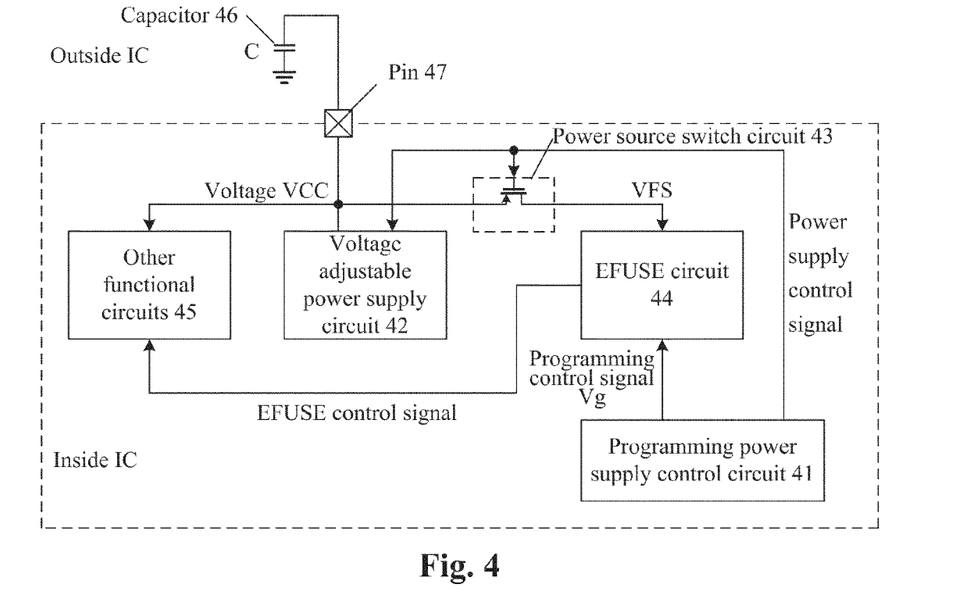
FIG. 4 illustrates a schematic diagram of a structure of an integrated circuit according to an embodiment of the invention.

An embodiment of the invention provides an integrated circuit integrated with an EFUSE circuit, as illustrated in FIG. 4, the integrated circuit includes a programming power supply control circuit 41, a voltage adjustable power supply circuit 42, a power source switch circuit 43, an EFUSE circuit 44 and other functional circuits 45.

The programming power supply control circuit 41 outputs a first power supply control signal to the voltage adjustable power supply circuit 42 and the power source switch circuit 43 and a first programming control signal to the EFUSE circuit 44; or outputs a second power supply control signal to the voltage adjustable power supply circuit 42 and the power source switch circuit 43 and a second programming control signal to the EFUSE circuit 44.

The power source switch circuit 43 receives the first power supply control signal and switches on a connection of the voltage adjustable power supply circuit 42 with the EFUSE circuit 44; or receives the second power supply control signal and switches off the connection of the voltage adjustable power supply circuit 42 with the EFUSE circuit 44.

The voltage adjustable power supply circuit 42 receives the first power supply control signal and outputs a first voltage signal to the EFUSE circuit 44 through the power source switch circuit 43 and to the other functional circuits 45 of the integrated circuit; or receives the second power supply control signal and outputs a second voltage signal to the other functional circuits 45 of the integrated circuit.

The EFUSE circuit 44 receives the first programming control signal and the first voltage signal and blows corresponding one of electronic fuses therein; or receives the second programming control signal and ensures the corresponding one of the electronic fuses therein not to be blown.

The integrated circuit according to the invention is detailed below by taking an example.

With the integrated circuit, to program an electronic fuse in the EFUSE circuit 44, the programming power supply control circuit 41 outputs a power supply control signal at a low level (i.e., the first power supply control signal) to the voltage adjustable power supply circuit 42 and the power source switch circuit 43 (which may be implemented with a P-type metal oxide semiconductor transistor in the example or with an N-type metal oxide semiconductor transistor or a triode in another example), so that in response to the power supply control signal at the low level, the power source switch circuit 43 switches on the connection of the voltage adjustable power supply circuit 42 with the EFUSE circuit 44 and the voltage adjustable power supply circuit 42 generates and outputs a voltage VCC between 3.8V and 4.2V (i.e., the first voltage signal) to the EFUSE circuit 44 through the closed power source switch circuit 43 as a voltage VFS to power the EFUSE circuit 44. The programming power supply control circuit 41 also outputs a programming control signal Vg at a high level (i.e., the first programming control signal) to the EFUSE circuit 44, and the EFUSE circuit 44 blows the electronic fuse therein in response to the power supply control signal at the low level and the programming control signal Vg at the high level to finish normal programming of the electronic fuse and thereafter outputs an EFUSE control signal to control the other functional circuits 45 of the integrated circuit to perform corresponding functions thereof.

Without programming any electronic fuse in the EFUSE circuit 44, the programming power supply control circuit 41 outputs a power supply control signal at a high level (i.e., the second power supply control signal) to the voltage adjustable power supply circuit 42 and the power source switch circuit 43, so that in response to the power supply control signal at the high level, the power source switch circuit 43 switches off the connection of the voltage adjustable power supply circuit 42 with the EFUSE circuit 44 and the voltage adjustable power supply circuit 42 generates the voltage VCC at 3.3V (i.e., the second voltage signal, which may also be at 5V, 2.5V, 1.8V or 1.2V). Since the voltage VCC at 3.3V may not be output to the EFUSE circuit 44 through the opened power source switch circuit 43, the voltage VFS floats. Furthermore, the programming power supply control circuit 41 outputs a programming control signal at a low level (i.e., the second programming control signal) to the EFUSE circuit 44, and the EFUSE circuit 44 may keep the electronic fuse therein intact since a condition on which no electronic fuse in the EFUSE circuit 44 may be programmed is satisfied.

The voltage adjustable power supply circuit 42 further outputs the voltage VCC between 3.8V and 4.2V or at 3.3V to the other functional circuits 45 of the integrated circuit to power the other functional circuits 45. Since the other functional circuits 45 of the integrated circuit are composed of high voltage MOS transistors which may endure 5V for a long period of time, the other functional circuits 45 of the integrated circuit still may normally operate upon being powered by the voltage VCC between 3.8V and 4.2V when programming the electronic fuse in the EFUSE circuit 44. Without programming, the other functional circuits 45 of the integrated circuit may also normally operate upon being powered by the voltage VCC at 3.3V which is a normal operation voltage.

Alternatively, the first power supply control signal may be at a high level and correspondingly the second power supply control signal may be at a low level dependent upon other specific circuit structures of the voltage adjustable power supply circuit 42 and the power source switch circuit 43.

Alternatively, the first programming control signal may be at a low level and correspondingly the second programming control signal may be at a high level dependent upon other specific circuit structures of the EFUSE circuit 44.

Preferably, in the present embodiment, the voltage adjustable power supply circuit 42 may further be connected with one terminal of a voltage regulator capacitor 46 arranged external to the integrated circuit through the pin 47 of the integrated circuit and may be configured to output the first voltage signal or the second voltage signal to the voltage regulator capacitor 46, and the voltage regulator capacitor 46 has the other terminal grounded and is configured to regulate the voltage VCC.

In another embodiment, the voltage regulator capacitor may alternatively be integrated in the integrated circuit and have one terminal grounded and the other terminal connected with the voltage adjustable power supply circuit 42.

Figure 5:
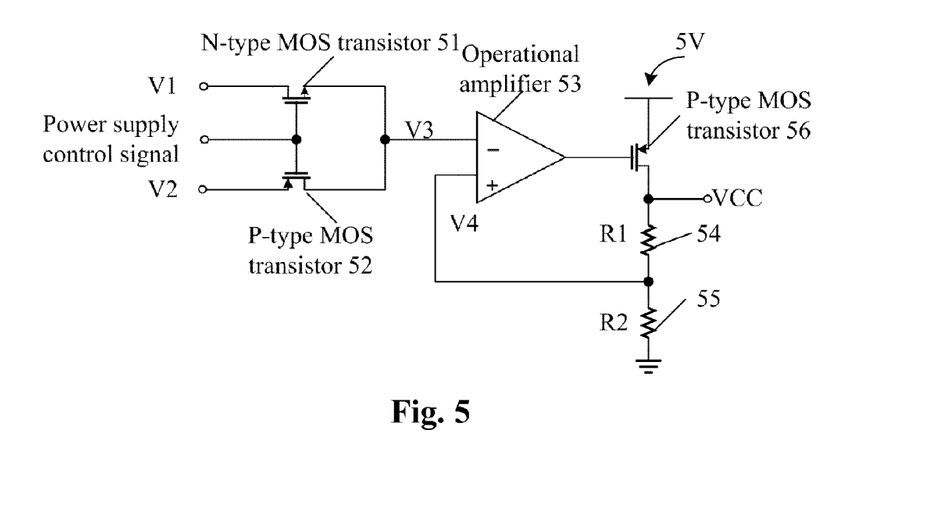
FIG. 5 illustrates a schematic diagram of a structure of a voltage adjustable power supply circuit in an integrated circuit according to an embodiment of the invention.

There is provided below a specific circuit of the voltage adjustable power supply circuit 42, as illustrated in FIG. 5, the circuit includes an N-type metal oxide semiconductor transistor 51, a P-type metal oxide semiconductor transistor 52, an operational amplifier 53, a resistor R1 54, a resistor R2 55 and a P-type metal oxide semiconductor transistor 56, which are connected as illustrated in FIG. 5.

The N-type metal oxide semiconductor transistor 51 has the drain to which a voltage V1 is input, and the P-type metal oxide semiconductor transistor 52 has the source to which a voltage V2 is input; the N-type metal oxide semiconductor transistor 51 and the P-type metal oxide semiconductor transistor 52 have their gates to which the power supply control signal (the first power supply control signal or the second power supply control signal) is input; the P-type metal oxide semiconductor transistor 56 has the source to which a voltage signal at 5V is input; and a terminal of the P-type metal oxide semiconductor transistor 56 connected with the resistor R1 54, i.e., the drain of the P-type metal oxide semiconductor transistor 56, outputs the voltage VCC (i.e., the first voltage signal or the second voltage signal).

The voltage adjustable power supply circuit illustrated in FIG. 5 is a linear voltage regulator capable of adjusting a reference voltage and operates in the following principle.

To program an electronic fuse in the EFUSE circuit, the power supply control signal is at a low level, and the N-type metal oxide semiconductor transistor 51 is turned off and the P-type metal oxide semiconductor transistor 52 is turned on so that the source of the N-type metal oxide semiconductor transistor 51 and the drain of the P-type metal oxide semiconductor transistor 52 are at a voltage V3 equal to V2. Since the inverting input and the in-phase input of the operational amplifier 53 are at the same voltage, the in-phase input of the operational amplifier 53 is at a voltage V4 equal to V3. On the principle of voltage division per resistor, the output voltage VCC satisfies the following relationships:

$$VCC = \frac{R_1 + R_2}{R_2} V_4 = \frac{R_1 + R_2}{R_2} V_3 = \frac{R_1 + R_2}{R_2} V_2 = \left(1 + \frac{R_1}{R_2}\right) V_2$$

$$3.8 < VCC = \left(1 + \frac{R_1}{R_2}\right) V_2 < 4.2$$

Without programming any electronic fuse in the EFUSE circuit, the power supply control signal is at a high level, and the N-type metal oxide semiconductor transistor 51 is turned on and the P-type metal oxide semiconductor transistor 52 is turned off so that the voltage V3 is equal to V1. Therefore the output voltage VCC satisfies the following relationships:

$$VCC = \frac{R_1 + R_2}{R_2}V_4 = \frac{R_1 + R_2}{R_2}V_3 = \frac{R_1 + R_2}{R_2}V_1 = \left(1 + \frac{R_1}{R_2}\right)V_1$$

$$VCC = \left(1 + \frac{R_1}{R_2}\right)V_1 \in \{5, 3.3, 2.5, 1.8, 1.2\}$$

When the circuit is designed, the voltages VCC, V1 and V2, and the resistor R1 54 and the resistor R2 55 may be configured to satisfy the above relationships, thereby implementing the function of the voltage adjustable power supply circuit.

For example, the circuit is designed so that V1=1.5V, V2=1.8V and R1/R2=1.8/1.5, and to program the electronic fuse in the EFUSE circuit:

$$VCC = \left(1 + \frac{1.8}{1.5}\right) \times 1.8 = 3.96$$

The voltage VCC at 3.96V between 3.8V and 4.2V satisfies the programming condition.

Without programming any electronic fuse in the EFUSE circuit:

$$VCC = \left(1 + \frac{1.8}{1.5}\right) \times 1.5 = 3.3$$

The voltage VCC at 3.3V satisfies the condition that no electronic fuse in the EFUSE circuit is programmed.

Figure 6:
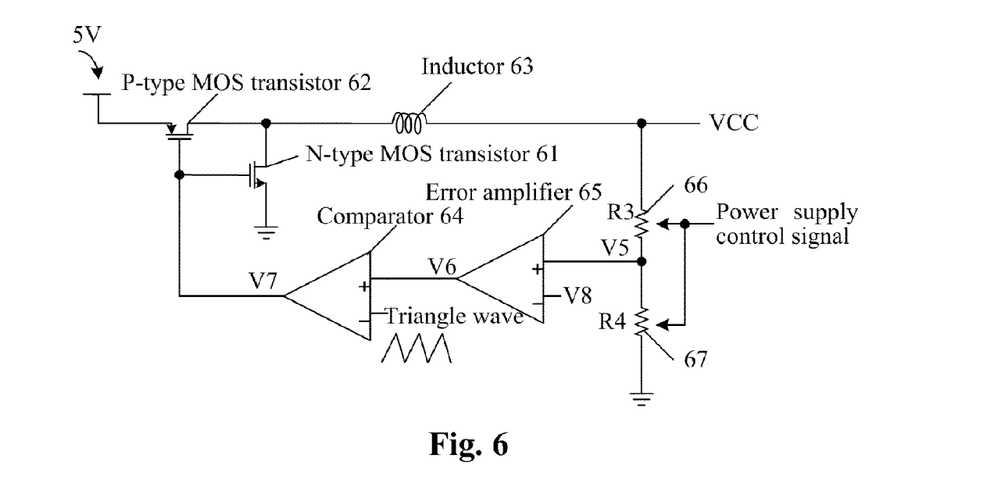
FIG. 6 illustrates a schematic diagram of another structure of a voltage adjustable power supply circuit in an integrated circuit according to an embodiment of the invention.

There is provided below another specific circuit of the voltage adjustable power supply circuit 42, as illustrated in FIG. 6, the circuit includes an N-type metal oxide semiconductor transistor 61, a P-type metal oxide semiconductor transistor 62, an inductor 63, a comparator 64, an error amplifier 65, a rheostat R3 66 and a rheostat R4 67, which are connected as illustrated in FIG. 6.

The P-type metal oxide semiconductor transistor 62 has the source to which a voltage signal at 5V is input; the comparator 64 has the inverting input to which a triangle wave signal is input; the error amplifier 65 has the inverting input to which a voltage V8 is input; the rheostat R3 66 and the rheostat R4 67 have their selection terminals to which the power supply control signal (the first power supply control signal or the second power supply control signal) is input; and the voltage VCC (i.e., the first voltage signal or the second voltage signal) is output from a terminal of the inductor 63 connected with the rheostat R3 66, i.e., a terminal of the rheostat R3 66 connected with the inductor 63.

The voltage adjustable power supply circuit illustrated in FIG. 6 is a DC-DC power source converter (particularly a step-down DC-DC power source converter) capable of adjusting a ratio of feedback resistors and operates on the following principle.

The voltage VCC is generated from the power source signal at 5V through the P-type metal oxide semiconductor transistor 62 and the inductor 63, and a voltage V5 is generated from the voltage VCC through voltage division of the circuit and input to the in-phase input of the error amplifier 65. If the voltage VCC is too high, the voltage V5 is above the voltage V8 (V8 is a system preset voltage which is set as required), and the error amplifier 65 amplifies the difference between the voltage V5 and the voltage V8 and outputs a voltage V6 at a high level. The comparator 64 compares V6 at the high level with the triangle wave voltage, and since the voltage V6 at the high level is higher, the comparator 64 outputs a voltage V7 at a high level for a long period of time, and the discharging N-type metal oxide semiconductor transistor 61 keeps on for a longer period of time than a period of time for which the powering P-type metal oxide semiconductor transistor 62 keeps on, so that the voltage VCC drops until the voltage V5 is equal to the voltage V8. If the voltage VCC is too low, the voltage V6 is at a low voltage, and the comparator 64 outputs the voltage V7 at a low level for a long period of time, and the powering P-type metal oxide semiconductor transistor 62 keeps on for a longer period of time than a period of time for which the discharging N-type metal oxide semiconductor transistor 61 keeps on, so that the voltage VCC rises until the voltage V5 is equal to the voltage V8. As may be apparent, regardless of whether the voltage VCC is high or low, the voltage V5 may be made equal to the voltage V8 and satisfy the following relationship:

$$V_5 = \frac{R_4}{R_3 + R_4} VCC = V_8$$

That is:

$$VCC = \frac{R_3 + R_4}{R_4}V_5 = \frac{R_3 + R_4}{R_4}V_8 = \left(1 + \frac{R_3}{R_4}\right)V_8$$

To program an electronic fuse in the EFUSE circuit, the ratio of the rheostat R3 66 to the rheostat R4 67 is adjusted by the power supply control signal to satisfy the following relationship:

$$3.8 < VCC = \left(1 + \frac{R_3}{R_4}\right)V_8 < 4.2$$

Without programming any electronic fuse in the EFUSE circuit, the ratio of the rheostat R3 66 to the rheostat R4 67 is adjusted by the power supply control signal to satisfy the following relationship:

$$VCC = \left(1 + \frac{R_3}{R_4}\right)V_8 \in \{5, 3.3, 2.5, 1.8, 1.2\}$$

When the circuit is designed, the voltages VCC and V8, the rheostat R3 66 and the rheostat R4 67 may be configured to satisfy the above relationships, thereby implementing the function of the voltage adjustable power supply circuit.

For example, the circuit is designed so that V8=1.5V and R3/R4=2.5/1.5 to program the electronic fuse in the EFUSE circuit:

$$VCC = \left(1 + \frac{2.5}{1.5}\right) \times 1.5 = 4$$

The voltage VCC at 4V between 3.8V and 4.2V satisfies the programming condition.

Without programming any electronic fuse in the EFUSE circuit, R3/R4=1.8/1.5 is configured:

$$VCC = \left(1 + \frac{1.8}{1.5}\right) \times 1.5 = 3.3$$

VCC at 3.3V satisfies the condition on which no electronic fuse in the EFUSE circuit is programmed.

Figure 7:
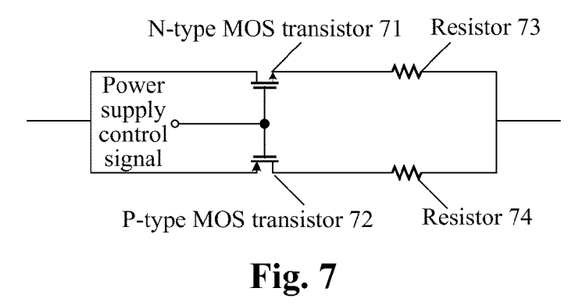
FIG. 7 illustrates a schematic diagram of a structure of a rheostat in a voltage adjustable power supply circuit in an integrated circuit according to an embodiment of the invention.

An embodiment of the invention further provides a specific circuit of the rheostat R3 66, as illustrated in FIG. 7, the circuit includes an N-type metal oxide semiconductor transistor 71, a P-type metal oxide semiconductor transistor 72, a resistor 73 and a resistor 74, which are connected as illustrated in FIG. 7.

The N-type metal oxide semiconductor transistor 71 and the P-type metal oxide semiconductor transistor 72 have their gates to which the power supply control signal (the first power supply control signal or the second power supply control signal) is input.

Figure 8:
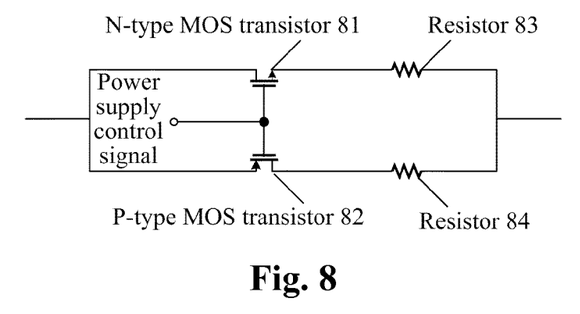
FIG. 8 illustrates a schematic diagram of another structure of a rheostat in a voltage adjustable power supply circuit in an integrated circuit according to an embodiment of the invention.

An embodiment of the invention further provides a specific circuit of the rheostat R4 67, as illustrated in FIG. 8, the circuit includes an N-type metal oxide semiconductor transistor 81, a P-type metal oxide semiconductor transistor 82, a resistor 83 and a resistor 84, which are connected as illustrated in FIG. 8.

The N-type metal oxide semiconductor transistor 81 and the P-type metal oxide semiconductor transistor 82 have their gates to which the power supply control signal (the first power supply control signal or the second power supply control signal) is input.

With the rheostats illustrated in FIGS. 7 and 8, the ratio of the rheostat R3 66 to the rheostat R4 67 is adjusted according to the power supply control signal. To program an electronic fuse in the EFUSE circuit, the power supply control signal is at a low level, and the N-type metal oxide semiconductor transistor 71 is turned off, the P-type metal oxide semiconductor transistor 72 is turned on, the N-type metal oxide semiconductor transistor 81 is turned off and the P-type metal oxide semiconductor transistor 82 is turned on, and the rheostat R3 66 turns to the resistor 74 and the rheostat R4 67 turns to the resistor 84. Therefore, the ratio of the resistor 74 to the resistor 84 is set to satisfy the above relationship between the rheostat R3 66 and the rheostat R4 67 to program the electronic fuse in the EFUSE circuit. Without programming any electronic fuse in the EFUSE circuit, the power supply control signal is at a high level, and the N-type metal oxide semiconductor transistor 71 is turned on, the P-type metal oxide semiconductor transistor 72 is turned off, the N-type metal oxide semiconductor transistor 81 is turned on and the P-type metal oxide semiconductor transistor 82 is turned off, and the rheostat R3 66 turns to the resistor 73 and the rheostat R4 67 turns to the resistor 83. Therefore, the ratio of the resistor 73 to the resistor 83 is set to satisfy the above relationship between the rheostat R3 66 and the rheostat R4 67 not to program any electronic fuse in the EFUSE circuit.

In conclusion, in the integrated circuit according to the embodiments of the invention, the voltage adjustable power supply circuit receives the first power supply control signal output from the programming power supply control circuit and outputs the first voltage signal to the EFUSE circuit through the power source switch circuit and to the other functional circuits of the integrated circuit, and the EFUSE circuit receives the first voltage signal and the first programming control signal output from the programming power supply control circuit to blow the corresponding one of electronic fuses in the EFUSE circuit; or the voltage adjustable power supply circuit receives the second power supply control signal output from the programming power supply control circuit and outputs the second voltage signal to the other functional circuits of the integrated circuit, and the EFUSE circuit receives the second programming control signal output from the programming power supply control circuit to ensure the corresponding one of the electronic fuses in the EFUSE circuit not to be blown, thereby decreasing the production and usage costs and saving the resources of pins of the integrated circuit as compared with the integrated circuit integrated with the EFUSE circuit in the prior art.

It will be appreciated that one skilled in the art may make various modifications and alterations to the present invention without departing from the scope of the present invention. Accordingly, if these modifications and alterations to the present invention fall within the scope of the claims of the present invention and their equivalents, the present invention intends to include all these modifications and alterations.

The invention claimed is:

1. An integrated circuit, comprising a programming power supply control circuit, a voltage adjustable power supply circuit, an electronic fuse circuit and a power source switch circuit, wherein:

the programming power supply control circuit outputs a first power supply control signal to the voltage adjustable power supply circuit and the power source switch circuit and outputs a first programming control signal to the electronic fuse circuit; or outputs a second power supply control signal to the voltage adjustable power supply circuit and the power source switch circuit and outputs a second programming control signal to the electronic fuse circuit;

the power source switch circuit receives the first power supply control signal and switches on a connection of the voltage adjustable power supply circuit with the electronic fuse circuit; or receives the second power supply control signal and switches off the connection of the voltage adjustable power supply circuit with the electronic fuse circuit;

the voltage adjustable power supply circuit receives the first power supply control signal and outputs a first voltage signal to the electronic fuse circuit through the power source switch circuit and to other functional circuits of the integrated circuit; or receives the second power supply control signal and outputs a second voltage signal to the other functional circuits of the integrated circuit; and the electronic fuse circuit receives the first programming control signal and the first voltage signal and blows corresponding one of electronic fuses in the electronic fuse circuit; or receives the second programming control signal and ensures the corresponding one of the electronic fuses in the electronic fuse circuit not to be blown.

2. The integrated circuit of claim 1, further comprising a voltage regulator capacitor having one terminal grounded and the other terminal connected with the voltage adjustable power supply circuit and receiving the first voltage signal or the second voltage signal.

3. The integrated circuit of claim 1, wherein the voltage adjustable power supply circuit is connected with one terminal of a voltage regulator capacitor arranged external to the integrated circuit through a pin of the integrated circuit and outputs the first voltage signal or the second voltage signal to the voltage regulator capacitor, and the voltage regulator capacitor has the other terminal grounded.

4. The integrated circuit of claim 1, wherein the voltage adjustable power supply circuit comprises a first N-type metal oxide semiconductor transistor, a first P-type metal oxide semiconductor transistor, an operational amplifier, a first resistor, a second resistor and a second P-type metal oxide semiconductor transistor, and wherein:

a gate of the first N-type metal oxide semiconductor transistor connects with a gate of the first P-type metal oxide semiconductor transistor; both a source of the first N-type metal oxide semiconductor transistor and a drain of the first P-type metal oxide semiconductor transistor connect with an inverting input of the operational amplifier; one terminal of the first resistor and one terminal of the second resistor connect with an in-phase input of the operational amplifier; the second resistor has the other terminal grounded; the first resistor has the other terminal connected with a drain of the second P-type metal oxide semiconductor transistor; and the second P-type metal oxide semiconductor transistor has a gate connected with an output of the operational amplifier; and the first N-type metal oxide semiconductor transistor has a drain to which a third voltage signal is input; the first P-type metal oxide semiconductor transistor has a source to which a fourth voltage signal is input; the first N-type metal oxide semiconductor transistor and the first P-type metal oxide semiconductor transistor have their gates to which the first power supply control signal or the second power supply control signal is input; the second P-type metal oxide semiconductor transistor has a source to which a voltage signal at 5V is input; and the other terminal of the first resistor and the drain of the second P-type metal oxide semiconductor transistor output the first voltage signal or the second voltage signal.

5. The integrated circuit of claim 1, wherein the voltage adjustable power supply circuit comprises a second N-type metal oxide semiconductor transistor, a third P-type metal oxide semiconductor transistor, an inductor, a comparator, an error amplifier, a first rheostat and a second rheostat, and wherein:

a drain of the third P-type metal oxide semiconductor transistor and a drain of the second N-type metal oxide semiconductor transistor connect with one terminal of the inductor; a gate of the third P-type metal oxide semiconductor transistor and a gate of the second N-type metal oxide semiconductor transistor connect with an output of the comparator; the second N-type metal oxide semiconductor transistor has a source grounded; the comparator has an in-phase input connected with an output of the error amplifier; one terminal of the first rheostat and one terminal of the second rheostat connect with an in-phase input of the error amplifier; the second rheostat has the other terminal grounded; and the other terminal of the inductor connects with the other terminal of the first rheostat; and the third P-type metal oxide semiconductor transistor has a source to which a voltage signal at 5V is input; the comparator has an inverting input to which a triangle wave signal is input; the error amplifier has an inverting input to which a fifth voltage signal is input; the first rheostat and the second rheostat have their selection terminals to which the first power supply control signal or the second power supply control signal is input; and the other terminal of the inductor and the other terminal of the first rheostat output the first voltage signal or the second voltage signal.

6. The integrated circuit of claim 5, wherein the first rheostat comprises a third N-type metal oxide semiconductor transistor, a fourth P-type metal oxide semiconductor transistor, a third resistor and a fourth resistor, and wherein:

the third N-type metal oxide semiconductor transistor and the fourth P-type metal oxide semiconductor transistor have their gates connected; the third N-type metal oxide semiconductor transistor has a drain connected with a source of the fourth P-type metal oxide semiconductor transistor; the third N-type metal oxide semiconductor transistor has a source connected with one terminal of the third resistor; the fourth P-type metal oxide semiconductor transistor has a drain connected with one terminal of the fourth resistor; and the other terminal of the third resistor connects with the other terminal of the fourth resistor; and the third N-type metal oxide semiconductor transistor and the fourth P-type metal oxide semiconductor transistor have their gates to which the first power supply control signal or the second power supply control signal is input.

7. The integrated circuit of claim 5, wherein the second rheostat comprises a fourth N-type metal oxide semiconductor transistor, a fifth P-type metal oxide semiconductor transistor, a fifth resistor and a sixth resistor, and wherein:

the fourth N-type metal oxide semiconductor transistor and the fifth P-type metal oxide semiconductor transistor have their gates connected; the fourth N-type metal oxide semiconductor transistor has a drain connected with a source of the fifth P-type metal oxide semiconductor transistor; the fourth N-type metal oxide semiconductor transistor has a source connected with one terminal of the fifth resistor; the fifth P-type metal oxide semiconductor transistor has a drain connected with one terminal of the sixth resistor; and the other terminal of the fifth resistor connects with the other terminal of the sixth resistor; and the fourth N-type metal oxide semiconductor transistor and the fifth P-type metal oxide semiconductor transistor have their gates to which the first power supply control signal or the second power supply control signal is input.

8. The integrated circuit of claim 1, wherein the power source switch circuit is a P-type metal oxide semiconductor transistor, an N-type metal oxide semiconductor transistor or a triode.

9. The integrated circuit of claim 1, wherein the first power supply control signal is at a low level, the first voltage signal is a voltage VCC between 3.8V and 4.2V, and the first programming control signal is at a high level.

10. The integrated circuit of claim 1, wherein the second power supply control signal is at a high level, the second voltage signal is a voltage VCC at 3.3V, and the second programming control signal is at a low level.

* * * * *